(12) United States Patent
Nie et al.

(10) Patent No.: US 10,056,536 B2
(45) Date of Patent: Aug. 21, 2018

(54) THERMOELECTRIC CONVERSION MATERIAL, THERMOELECTRIC CONVERSION ELEMENT, THERMOELECTRIC CONVERSION MODULE, THERMOELECTRIC GENERATOR, THERMOELECTRIC CONVERSION SYSTEM, AND METHOD OF MANUFACTURING THERMOELECTRIC CONVERSION MATERIAL

(71) Applicant: FURUKAWA CO., LTD., Tokyo (JP)

(72) Inventors: Ge Nie, Ibaraki (JP); Atsuro Sumiyoshi, Ibaraki (JP); Taketoshi Tomida, Ibaraki (JP); Takahiro Ochi, Ibaraki (JP); Shogo Suzuki, Ibaraki (JP); Masaaki Kikuchi, Ibaraki (JP); Junqing Guo, Ibaraki (JP)

(73) Assignee: FURUKAWA CO., LTD., Tokyo (JP)

( * ) Notice: Subject to any disclaimer, the term of this patent is extended or adjusted under 35 U.S.C. 154(b) by 0 days.

(21) Appl. No.: 15/072,528

(22) Filed: Mar. 17, 2016

(65) Prior Publication Data

US 2016/0276564 A1 Sep. 22, 2016

(30) Foreign Application Priority Data

Mar. 19, 2015 (JP) .................................. 2015-056207

(51) Int. Cl.
| | |
|---|---|
| *H01L 35/16* | (2006.01) |
| *H01L 35/04* | (2006.01) |
| *H01L 35/34* | (2006.01) |
| *C22C 1/04* | (2006.01) |
| *C22C 12/00* | (2006.01) |
| *B22F 7/08* | (2006.01) |

(52) U.S. Cl.
CPC ............ *H01L 35/16* (2013.01); *C22C 1/0491* (2013.01); *C22C 12/00* (2013.01); *H01L 35/04* (2013.01); *H01L 35/34* (2013.01); *B22F 7/08* (2013.01); *B22F 2998/10* (2013.01)

(58) Field of Classification Search
CPC ....... C22C 1/0491; H01L 35/16; H01L 35/34; H01L 35/04
See application file for complete search history.

(56) References Cited

U.S. PATENT DOCUMENTS

| | | | |
|---|---|---|---|
| 2006/0017170 A1* | 1/2006 | Chen ...................... | H01L 35/18 257/763 |
| 2011/0108778 A1* | 5/2011 | Ren ....................... | B82Y 30/00 252/521.1 |

FOREIGN PATENT DOCUMENTS

| | | |
|---|---|---|
| JP | 2002-026400 | 1/2002 |
| WO | 2008008638 | 1/2008 |
| WO | 2009135013 | 11/2009 |

OTHER PUBLICATIONS

Xi et al., "Systematic Study of the Multiple-Element Filling in Caged Skutterudite CoSb3," Chem. Mater. 2010, 22, 2384-2394, DOI:10.1021/cm903717w.*

(Continued)

*Primary Examiner* — Angelo Trivisonno
(74) *Attorney, Agent, or Firm* — Rankin, Hill & Clark LLP

(57) ABSTRACT

Provided is a thermoelectric conversion material including a plurality of kinds of phases including a first phase and a second phase which have elemental compositions different from each other. The first phase and the second phase have a skutterudite structure.

11 Claims, 12 Drawing Sheets

(56) References Cited

OTHER PUBLICATIONS

Duan et al., "Enhanced thermoelectric performance in sulfur-doped Co4Sb11.9—xTexS0.1 skutterudites," Materials Letters 79 (2012) 69-71.*
Xi et al., "Systematic Study of the Multiple-Element Filling in Caged Skutterudite CoSb3," Chem. Mater. 2010, 22, 2384-2394, DOI: 10.1021/cm903717w (Year: 2010).*
Duan et al., "Enhanced thermoelectric performance in sulfur-doped Co4Sb11.9—xTexS0.1 skutterudites," Materials Letters 79 (2012) 69-71 (Year: 2012).*
Extended European Search Report dated Aug. 22, 2016 issued in the corresponding European patent application No. 16160697.5.

\* cited by examiner

THERMOELECTRIC CONVERSION MATERIAL, THERMOELECTRIC CONVERSION ELEMENT, THERMOELECTRIC CONVERSION MODULE, THERMOELECTRIC GENERATOR, THERMOELECTRIC CONVERSION SYSTEM, AND METHOD OF MANUFACTURING THERMOELECTRIC CONVERSION MATERIAL

This application is based on Japanese patent application No. 2015-056207, the content of which is incorporated hereinto by reference.

BACKGROUND

Technical Field

The present invention relates to a thermoelectric conversion material, a thermoelectric conversion element, a thermoelectric conversion module, a thermoelectric generator, a thermoelectric conversion system, and a method of manufacturing a thermoelectric conversion material.

Related Art

An improvement in thermoelectric conversion performance is required for a thermoelectric conversion material. For example, Japanese Unexamined Patent Publication No. 2002-26400 describes a thermoelectric conversion material that uses a rare-earth element and a transition metal material.

SUMMARY

The present inventors have made a thorough investigation, and as result, they found that it is difficult for the method described in Japanese Unexamined Patent Publication No. 2002-26400 to be able to cope with the demand for an improvement in additional thermoelectric conversion efficiency.

An object of the invention is to provide a thermoelectric conversion material excellent in thermoelectric conversion performance.

In one embodiment, there is provided a thermoelectric conversion material including a plurality of kinds of phases including a first phase and a second phase which have elemental compositions different from each other. The first phase and the second phase have a skutterudite structure.

In another embodiment, there is provided a thermoelectric conversion element including the thermoelectric conversion material, and an electrode.

In still another embodiment, there is provided a thermoelectric conversion module including the thermoelectric conversion element.

In still another embodiment, there is provided a thermoelectric generator including the thermoelectric conversion element.

In still another embodiment, there is provided a thermoelectric conversion system including the thermoelectric conversion element.

In still another embodiment, there is provided a method of manufacturing a thermoelectric conversion material. The method includes preparing a plurality of kinds of alloy powders, obtaining a mixture in which the plurality of kinds of alloy powders are mixed, and sintering the mixture. The plurality of kinds of alloy powders include a first alloy powder, and a second alloy powder that is different from the first alloy powder, and the first alloy powder and the second alloy powder have a skutterudite structure.

According to the embodiments of the invention, it is possible to provide a thermoelectric conversion material excellent in thermoelectric conversion performance.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
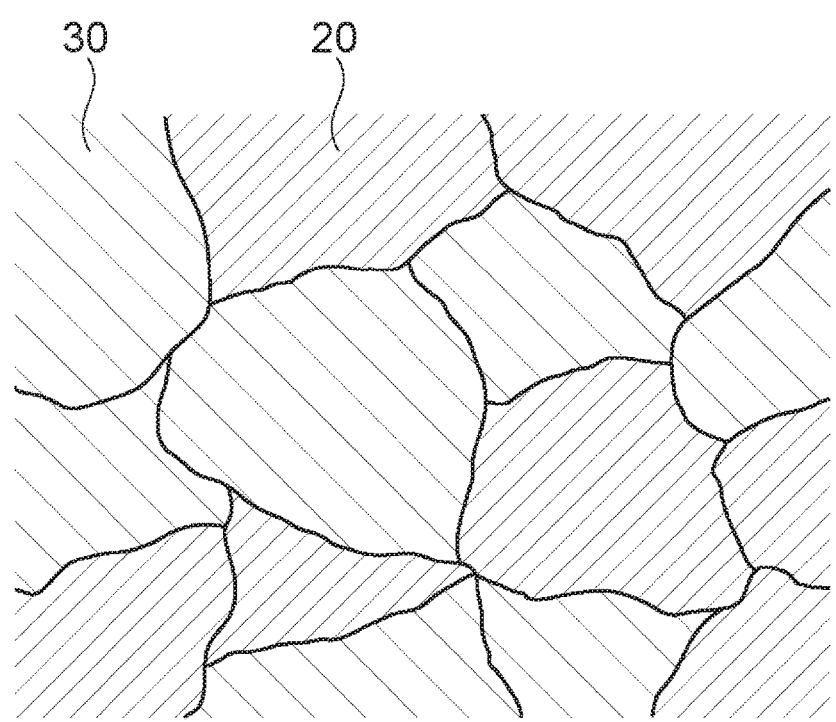
FIG. 1 is a view illustrating a cross-sectional structure of a thermoelectric conversion material according an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiments of the invention will be described with reference to the accompanying drawings. Furthermore, in all of the drawings, the same reference numerals will be given to the same constituent elements, and description thereof will not be repeated.

Unless specified otherwise, "(a numerical value) to (a numerical value)" denotes a range equal to or more than (a numerical value) and equal to or less than (a numerical value).

FIG. 1 is a view illustrating a cross-sectional structure of a thermoelectric conversion material 10 according to this embodiment. The thermoelectric conversion material 10 according to this embodiment includes a plurality of kinds of phases including a first phase 20 and a second phase 30 which have elemental compositions different from each other. The first phase 20 and the second phase 30 have a skutterudite structure. Hereinafter, detailed description will be given.

First, an index that indicates the performance of the thermoelectric conversion material will be described below.

The properties of the thermoelectric conversion material are evaluated by a figure of merit Z. The figure of merit Z is expressed by the following Expression (1) that uses a Seebeck coefficient S, thermal conductivity κ, and electrical resistivity ρ.

$$Z=S^2/(\kappa\rho) \quad \text{Expression (1)}$$

In addition, the properties of the thermoelectric conversion material may be evaluated by the product of the figure of merit Z and a temperature T. In this case, the following Expression (2) is set by multiplying both sides of Expression (1) by the temperature T (here, T represents an absolute temperature).

$$ZT=S^2T/(\kappa\rho) \quad \text{Expression (2)}$$

ZT in Expression (2) is called a dimensionless figure of merit, and becomes an index indicating the performance of the thermoelectric conversion material. In the thermoelectric conversion material, the greater the value of ZT is, the higher the thermoelectric conversion performance at the temperature T is. From Expression (1) and Expression (2), it can be said that an excellent thermoelectric conversion material is a material in which a value of the figure of merit Z is large, that is, a material of which the Seebeck coefficient S is large, and the thermal conductivity κ and the electrical resistivity ρ are low.

In addition, in a case of evaluating the performance of the thermoelectric conversion material from the electrical viewpoints, a power factor P expressed by the following Expression (3) may be used.

$$P=S^2/\rho \quad \text{Expression (3)}$$

Furthermore, the Seebeck coefficient S and the electrical resistivity ρ can be measured by using, for example, a thermoelectric performance measuring device (ZEM-2, manufactured by Ulvac rico Co., Ltd). In addition, the thermal conductivity κ can be obtained from a relationship of $\kappa=\alpha \cdot d \cdot C_p$. Here, a density d can be measured by using a density meter at room temperature and thermal diffusivity α can be measured at each temperature by using, for example, a laser flash method thermal constant measuring device (TC-7000H, manufactured by Ulvac rico Co., Ltd). In addition, specific heat $C_p$ can be measured at each temperature by using, for example, a thermal analyzer for differential scanning calorimetry.

Hereinafter, the thermoelectric conversion material according to this embodiment will be described in detail.

A thermoelectric conversion material 10 according to this embodiment includes a first phase 20 and a second phase 30. The first phase 20 and the second phase 30 have a skutterudite structure, and have elemental compositions different from each other. Furthermore, the skutterudite structure may be an unfilled skutterudite structure or a filled skutterudite structure. It is preferable that the thermoelectric conversion material 10 mainly has the skutterudite structure as a whole. The thermoelectric conversion material 10 includes the first phase 20 and the second phase 30, and is excellent in thermoelectric conversion performance.

Although not clear, the reason for the preference is considered as follows. In a thermoelectric conversion material that is constituted by one phase, when one side of the thermal conductivity κ and the electrical resistivity ρ is lowered, the other side is raised, and thus it is difficult to lower both sides. In contrast, the thermoelectric conversion material 10 includes a phase having relatively low thermal conductivity, and a phase having relatively low electrical resistivity. Accordingly, it is possible to lower the thermal conductivity κ and the electrical resistivity ρ of the thermoelectric conversion material 10, and thus it is considered that it is possible to increase the figure of merit Z obtained from Expression (1) and the dimensionless figure of merit ZT obtained from Expression (2). Although not clear, the reason for the possibility is considered as follows. Electrical conduction and thermal conduction occur in routes different from each other.

Here, it is preferable that each volume content of the first phase 20 and the second phase 30 in the thermoelectric conversion material 10 is equal to or more than 10%, and more preferably equal to or more than 20%. As described above, when each of the first phase 20 and the second phase 30 occupies a volume to a certain degree, characteristics of each phase contribute to all the characteristics of the thermoelectric conversion material 10 in a relatively clear manner, and thus it is possible to improve the thermoelectric conversion performance.

It is preferable that each of the first phase 20 and the second phase 30 has a composition expressed by General Formula $R_rT_tX_x$ ($0 \le r \le 1$, $3 \le t \le 5$, and $9 \le x \le 15$) from the viewpoint of improving the thermoelectric conversion performance. Here, R represents one or more kinds of elements selected from the group consisting of rare-earth elements, alkali metal elements, alkali-earth metal elements, elements of Group 4, and elements of Group 13. T represents one or more kinds of elements selected from the group consisting of transition metal elements excluding rare-earth elements and elements of Group 4. X represents one or more kinds of elements selected from the group consisting of elements of Group 14, elements of Group 15, and elements of Group 16.

Examples of the rare-earth elements include Sc, Y, La, Ce, Pr, Nd, Sm, Eu, Gd, Tb, Dy, Ho, Er, Tm, Yb, and Lu. Examples of the alkali metal elements include Li, Na, K, Rb, Cs, and Fr. Examples of the alkali-earth metal elements include Ca, Sr, and Ba. Examples of the elements of Group 4 include Ti, Zr, and Hf. Examples of the elements of Group 13 include B, Al, Ga, In, and Tl.

In a p-type thermoelectric conversion material, for example, one or more kinds of elements, which are selected from the group consisting of La, Ce, and Pr which are rare-earth elements, Ti, Zr, and Hf which are elements of Group 4, and Al, Ga, and In which are elements of Group 13, may be mainly set as R. In an n-type thermoelectric conversion material, for example, one or more kinds of elements, which are selected from the group consisting of Yb, La, Ce, and Pr which are rare-earth elements, Ca, Sr, and Ba which are alkali-earth metal elements, and Al, Ga, and In which are elements of Group 13, may be mainly set as R. The thermoelectric conversion material may be the n-type or the p-type. In addition, when the thermoelectric conversion material is the n-type, it is possible to improve the thermoelectric conversion performance in a more effective manner.

It is preferable that R is four or more elements selected from the group consisting of rare-earth elements, alkali-metal elements, alkali-earth metal elements, elements of Group 4, and elements of Group 13 from the viewpoint of improving the thermoelectric conversion performance. In addition, it is more preferable that the four or more kinds of elements include three kinds of elements of groups different from each other.

Although not particularly limited, examples of the transition metal elements excluding the rare-earth element and the elements of Group 4 include Fe, Ru, Os, Co, Pd, Ni, and Pt. From the viewpoint of improving the thermoelectric conversion performance, it is more preferable that T represents one or more kinds of elements selected from Fe, Co, and Ni.

Examples of the elements of Group 14 include C, Si, Ge, Sn, and Pb. Examples of the elements of Group 15 include N, P, As, Sb, and Bi. In addition, examples of elements of Group 16 include O, S, Se, Te, and Po. In addition, it is preferable that X represents one or more kinds of elements selected from the group consisting of elements of Group 14, elements of Group 15 excluding nitrogen, and elements of Group 16 excluding oxygen, and it is more preferable that X includes Sb.

Here, from the viewpoint of improving the thermoelectric conversion performance, it is preferable that in at least one phase of the first phase 20 and the second phase 30, X includes an element of Group 16, and more preferably sulfur (S). On the other hand, from the same viewpoint, it is preferable that in one of the first phase 20 and the second phase 30, X includes an element of Group 16, and in the other phase, X does not include an element of Group 16. In addition, it is more preferable that in one phase of the first phase 20 and the second phase 30, X includes sulfur, and in the other phase, X does not contain sulfur.

On the other hand, it is preferable that in both the first phase 20 and the second phase 30, X includes an element of Group 15, and more preferably Sb.

A structure or a volume content of a crystal phase that constitutes the thermoelectric conversion material 10 can be confirmed by, for example, an X-ray diffraction method. In a case where a difference in an elemental composition is not great, it may be difficult to confirm existence of a plurality of phases with the X-ray diffraction method. However, in this case, the number of phases, an elemental composition of the phases, or the volume content of the phases can be confirmed, for example, by analyzing a cross-section of the thermoelectric conversion material 10 with a scanning electron microscope (SEM)-energy dispersive X-ray spectroscopy (EDX or EDS), or an electron probe micro analyzer (EPMA). In the thermoelectric conversion material 10, a grain aggregate is formed in each of a plurality of phases including the first phase 20 and the second phase 30. The size of the grain aggregate is not particularly limited.

From the viewpoint of improving the thermoelectric conversion performance, it is preferable that the maximum value of the thermal conductivity of the thermoelectric conversion material 10 in a temperature range of equal to or higher than 100° C. and equal to or lower than 600° C. is set to be equal to or less than 4.00 W/(m·K), and more preferably equal to or less than 3.80 W/(m·K). On the other hand, from the viewpoint of improving the thermoelectric conversion performance, it is preferable that the maximum value of the electrical resistivity of the thermoelectric conversion material 10 in a temperature range of equal to or higher than 100° C. and equal to or lower than 600° C. is set to be equal to or less than $18.00 \times 10^{-6}$ Ω·m, and more preferably equal to or less than $12.00 \times 10^{-6}$ Ω·m. In addition, from the same viewpoint, it is preferable that the maximum value of the thermal conductivity of the thermoelectric conversion material 10 in a temperature range of equal to or higher than 100° C. and equal to or lower than 600° C. is set to be equal to or less than 4.00 W/(m·K), and the maximum value of the electrical resistivity in a temperature range of equal to or higher than 100° C. and equal to or lower than 600° C. is set to be equal to or less than $15.00 \times 10^{6}$ Ω·m, and it is more preferable that the maximum value of the thermal conductivity in the temperature range is set to be equal to or less than 3.80 W/(m·K), and the maximum value of the electrical resistivity in the temperature range is set to be equal to or less than $13.00 \times 10^{-6}$ Ω·m. The thermal conductivity and the electrical resistivity of the thermoelectric conversion material 10 can be controlled by adjusting the elemental composition and the volume content of the first phase 20 and the second phase 30.

The maximum value of the dimensionless figure of merit ZT of the thermoelectric conversion material 10 in a temperature range of equal to or higher than 100° C. and equal to or lower than 600° C. can be set to be equal to or more than 0.70, and preferably equal to or more than 1.00.

On the other hand, the maximum value of the power factor P of the thermoelectric conversion material 10 in a temperature range of equal to or higher than 100° C. and equal to or lower than 600° C. can be set to be equal to or more than $3.00 \times 10^{-3}$ W/(m·K$^2$), and preferably equal to or more than $3.45 \times 10^{-3}$ W/(m·K$^2$).

Furthermore, in a case where the thermoelectric conversion material 10 is constituted by two phases including the first phase 20 and the second phase 30, it is preferable that a volume ratio between the first phase 20 and the second phase 30 (first phase:second phase) is in a range of 10:90 to 90:10, and more preferably in a range of 20:80 to 80:20.

Furthermore, in addition to the first phase 20 and the second phase 30, the thermoelectric conversion material 10 may further include one or more phases having a different elemental composition. Although not particularly limited, it is preferable that the different phase has the skutterudite structure. In addition, a volume content of the different phase is not particularly limited. In a case where the thermoelectric conversion material 10 is constituted by three or more phases, for example, the first phase 20 and the second phase 30 represent a phase having a skutterudite structure in which the volume content thereof ranks the first in the thermoelectric conversion material 10, and a phase having a skutterudite structure in which the volume content thereof ranks the second in the thermoelectric conversion material 10, respectively. In this case, it is preferable that a volume ratio between the first phase 20 and the second phase 30 (first phase:second phase) is in a range of 10:90 to 90:10, and more preferably in a range of 20:80 to 80:20.

A method of manufacturing the thermoelectric conversion material 10 according to this embodiment includes a process of preparing a plurality of kinds of alloy powders, a process of obtaining a mixture in which the plurality of kinds of alloy powders are mixed, and a process of sintering the mixture. The plurality of kinds of alloy powders include a first alloy powder, and a second alloy powder of a kind that is different from that of the first alloy powder. All of the first alloy powder and the second alloy powder have the skutterudite structure. Hereinafter, detailed description will be given.

First, the plurality of kinds of alloy powders including the first alloy powder and the second alloy powder are prepared. It is considered that a structure and an elemental composition of each phase, which constitutes the thermoelectric conversion material 10 that is obtained, is based on a structure and an elemental composition of each alloy powder. It is possible to adjust the structure and the elemental composition of each of the phases of the thermoelectric conversion material 10 by adjusting the structure and the elemental composition of the alloy powders.

Although not particularly limited, the process of preparing the plurality of kinds of alloy powders can be performed by using, for example, a melting method or a rapid solidification method.

In a case of using the melting method, raw materials of elementary substances (for example, a pure metal) are put into a crucible in a predetermined ratio and are heated and melted, for example, to a temperature of 1000° C. to 1250° C. through heating with an electric furnace in an inert gas atmosphere, and the resultant molten material is retained as is for 5 hours. Examples of the inert gas include an Ar gas and a $N_2$ gas. Then, cooling-down to room temperature is performed at a rapid rate so as to secure composition uniformity. A material that is rapidly cooled down with water is pulverized to obtain an alloy powder.

On the other hand, examples of the rapid solidification method include a gas atomizing method, a water atomizing method, a single-roller method, and a double-roller method. Among these, for example, in a case of using the gas atomizing method, raw materials of elementary substances (for example, a pure metal) are put into a crucible in a predetermined ratio, the elementary substances are heated and melted to a temperature that is equal to or higher than the melting point of the resultant alloy, for example, approximately 1200° C. to 1250° C. through high-frequency heating in an inert gas atmosphere, and retention is performed as is for 2 hours. Then, the resultant molten raw material is atomized with an atomization device, for example, at an Ar spraying pressure of approximately 0.5 MPa to 20 MPa by using a spraying nozzle having a diameter of φ2 mm, thereby obtaining an alloy powder.

A plurality of kinds of alloy powders are prepared by the same method, respectively. The plurality of kinds of alloy powders are different in at least an elemental composition. In the above-described method, it is possible to obtain alloy powders having a crystal structure and an elemental composition, which are desired, by adjusting the blend of raw materials put into the crucible. A preferred elemental composition of the alloy powders is the same as in the first phase 20 and the second phase 30 of the thermoelectric conversion material 10. In addition, in a case where at least one of a first alloy powder and a second alloy powder includes sulfur as X, it is preferable that the sulfur content occupies 1/1200 or more of x in General Formula $R_rT_tX_x$, and more preferably 1/120 or more. In addition, it is preferable that the content is 12/120 or less of x, and more preferably 6/120 or less.

Here, from the viewpoint of improving the thermoelectric conversion performance of the thermoelectric conversion material 10, it is preferable that all of the maximum values of Seebeck coefficient absolute values of the plurality of kinds of alloy powders are equal to or more than 150 μV/K, and more preferably equal to or more than 180 μV/K. In addition, from the same viewpoint, it is preferable that in at least one of the first alloy powder and the second alloy powder, the maximum value of thermal conductivity in a temperature range of equal to or higher than 100° C. and equal to or lower than 600° C. is equal to or less than 4.00 W/(m·K), and more preferably equal to or less than 3.80 W/(m·K). In addition, from the same viewpoint, it is preferable that in at least one of the first alloy powder and the second alloy powder, the maximum value of electrical resistivity in a temperature range of equal to or higher than 100° C. and equal to or lower than 600° C. is equal to or less than $18.00 \times 10^{-6}$ Ω·m, and more preferably equal to or less than $12.00 \times 10^{-6}$ Ω·m. Here, the Seebeck coefficient, the thermal conductivity, and the electrical resistivity when measuring samples, which are obtained through sintering in a state in which the content of the respective alloy powders is set to 100%, can be regarded as the Seebeck coefficient, the thermal conductivity, and the electrical resistivity of the alloy powders. Here, an apparent density of the samples is set to be equal to or more than 90% of a true density thereof.

Then, in the process of obtaining a mixture, the plurality of kinds of alloy powders, which are prepared, are mixed with each other. For example, the mixing is uniformly performed in a short period of time by using a ball mill device. At this time, it is possible to adjust the volume content of each phase of the thermoelectric conversion material 10 by adjusting a blending ratio of the respective alloy powders. It is preferable that each volume content of the first alloy powder and the second alloy powder in the mixture is set to be equal to or more than 10%, and more preferably equal to or more than 20%. Here, among alloy powders which constitute the thermoelectric conversion material 10, for example, the first alloy powder and the second alloy powder represent an alloy powder having a skutterudite structure in which the volume content thereof ranks the first, and an alloy powder having a skutterudite structure in which the volume content thereof ranks the second.

Furthermore, in a case where the plurality of kinds of alloy powders are two kinds including the first alloy powder and the second alloy powder, it is preferable that the volume ratio between the first alloy powder and the second alloy powder (first alloy powder:the second alloy powder) is in a range of 10:90 to 90:10, and more preferably in a range of 20:80 to 80:20.

In addition, in a case where the plurality of kinds of alloy powders are three or more kinds of alloy powders, for example, on the assumption that among the plurality of kinds of alloy powders, an alloy powder of which the volume content ranks the first is set as the first alloy powder, and an alloy powder of which the volume content ranks the second is set as the second alloy powder, it is preferable that a volume ratio between the first alloy powder and the second alloy powder (first alloy powder:the second alloy powder) is in a range of 10:90 to 90:10, and more preferably in a range of 20:80 to 80:20.

Next, in the process of sintering the mixture, a hot pressing method, a heating and sintering method, a spark plasma sintering method, and the like can be used.

In a case of using the spark plasma sintering method, the mixture that is obtained is put into a carbon die, and heating is performed to a temperature of 500° C. to 750° C. during application of a pulse current in a vacuum or inert gas atmosphere at a pressure of 5 MPa to 60 MPa. After being retained as is for 10 minutes, the mixture is cooled down to room temperature to obtain the thermoelectric conversion material 10.

Next, description will be given of a thermoelectric conversion element 40 according to this embodiment.

Figure 2:
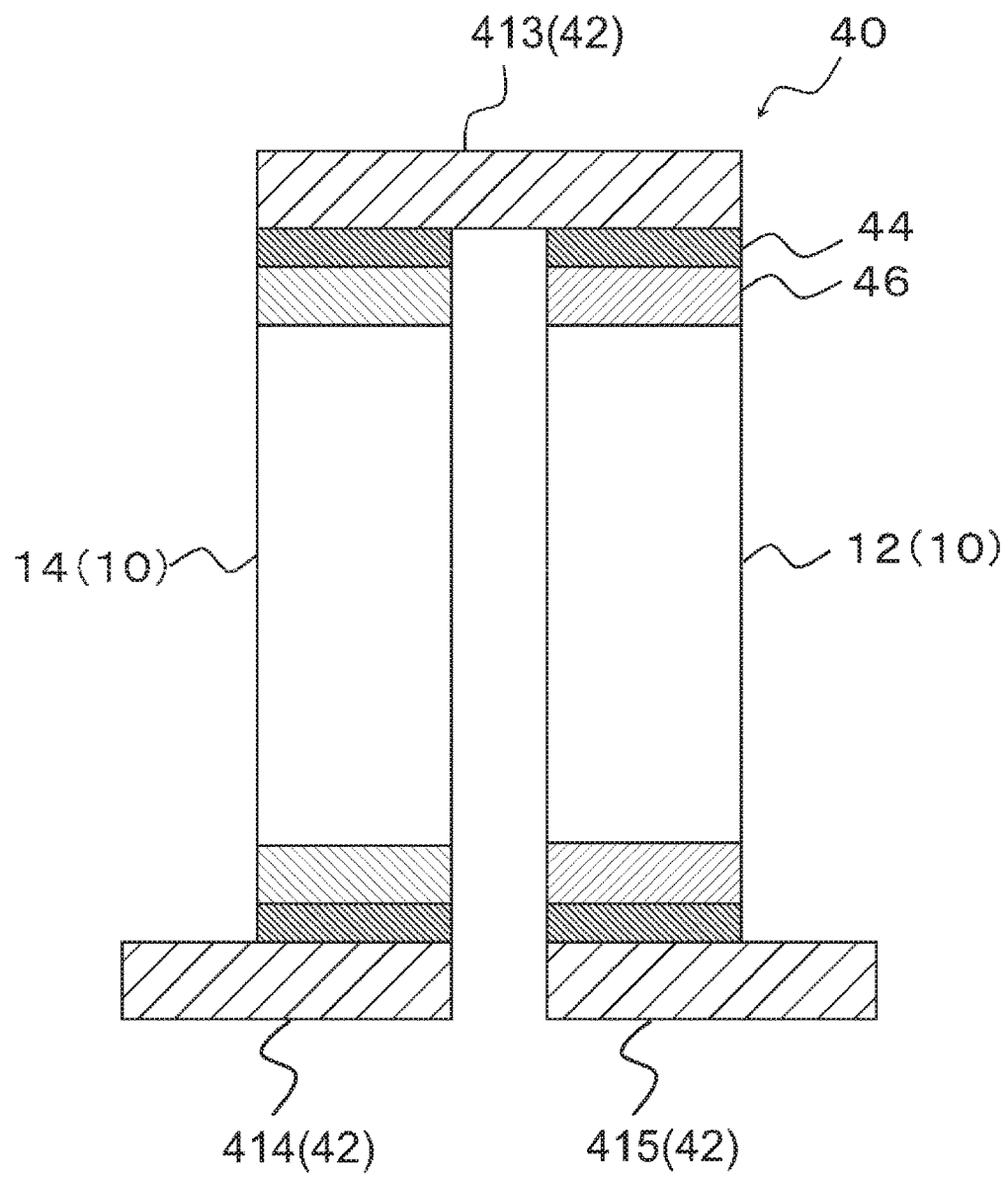
FIG. 2 is a view illustrating a structure of a thermoelectric conversion element according to an embodiment.

FIG. 2 is a view illustrating a structure of the thermoelectric conversion element 40 according to this embodiment. The thermoelectric conversion element 40 includes the thermoelectric conversion material 10 and an electrode 42. Details thereof will be described below.

The thermoelectric conversion element 40 according to this embodiment includes at least one n-type thermoelectric conversion material 12 and at least one p-type thermoelectric conversion material 14 as the thermoelectric conversion material 10. In addition, the thermoelectric conversion element 40 further includes a plurality of electrodes 42, a joining member 44, and a diffusion prevention member 46. In the thermoelectric conversion element 40, one or more pairs of the n-type thermoelectric conversion material 12 and the p-type thermoelectric conversion material 14 are electrically connected to each other in series. Thermal energy can be directly converted into electric energy by using the thermoelectric conversion element 40. Alternatively, the electric energy can be directly converted into the thermal energy.

As the electrode 42, the thermoelectric conversion element 40 includes a first that electrically connects one end of the p-type thermoelectric conversion material 14 and one end of the n-type thermoelectric conversion material 12, a second electrode 414 that is connected to the other end of the p-type thermoelectric conversion material 14, and a third electrode 415 that is connected to the other end of the n-type thermoelectric conversion material 12.

Each of the n-type thermoelectric conversion material 12 and the p-type thermoelectric conversion material 14, and each of the electrodes 42 are joined through the joining member 44 and the diffusion prevention member 46. The joining member 44 and the diffusion prevention member 46 are provided to be laminated between the thermoelectric conversion material 10 and the electrode 42, and the joining member 44 is joined to the electrode 42, and the diffusion prevention member 46 is joined to the thermoelectric conversion material 10.

Although not particularly limited, it is preferable that the electrode 42 is composed of at least one kind of alloy that is selected from the group consisting of an Fe alloy, a Co alloy, a Ni alloy, a Cu alloy, a Ti alloy, and an Al alloy. In addition, the electrode 42 may be at least one kind of metal that is selected from the group consisting of, for example, iron, cobalt, nickel, copper, titanium, and aluminum. In addition, as a material of the electrode 42, it is more preferable to use an alloy having the same composition as an alloy layer of the joining member 44. According to this, it is possible to enhance adhesiveness between the electrode 42 and the joining member 44.

From the viewpoint of mitigating a thermal stress, it is preferable that the joining member 44 is composed of at least one kind of alloy that is selected from the group consisting of a Cu alloy, a Ag alloy, a Au alloy, and an Al alloy.

From the viewpoint of preventing diffusion of constituent elements of the thermoelectric conversion material 10, it is preferable that the diffusion prevention member 46 is composed of at least one kind of alloy selected from the group consisting of an Fe-M1 alloy (M1 represents at least one kind of element selected from the group consisting of Cr, Mo, W, V, Nb, Ta, Mn, Ti, Zr, Hf, C, Si, and Ge), a Co-M1 alloy, an Ni-M1 alloy, a Ti-M2 alloy (M2 represents at least one kind of alloy selected from the group consisting of Al, Ga, In, Cu, Ag, Au, Sn, Zn, and Mg), a Zr-M2 alloy, a Hf-M2 alloy, a V-M2 alloy, a Nb-M2 alloy, a Ta-M2 alloy, a Cr-M2 alloy, an Mo-M2 alloy, and a W-M2 alloy.

Furthermore, the joining member 44 and the diffusion prevention member 46 may be constituted by one kind of alloy layer, respectively, but may be constituted by two or more kinds of alloy layers, respectively.

The joining member 44 and the diffusion prevention member 46 can be laminated on the thermoelectric conversion material 10 by a method such as soldering, sputtering, vapor deposition, thermal spraying, and a spark plasma sintering method.

The electrode 42 can be laminated on the joining member 44 by a known method such as soldering, sputtering, vapor deposition, thermal spraying, a spark plasma sintering method, and micro-laser welding.

In addition, in this embodiment, description has been given of the thermoelectric conversion element 40 that includes the joining member 44 and the diffusion prevention member 46, but any one or both of the joining member 44 and the diffusion prevention member 46 may be omitted.

Figure 3:
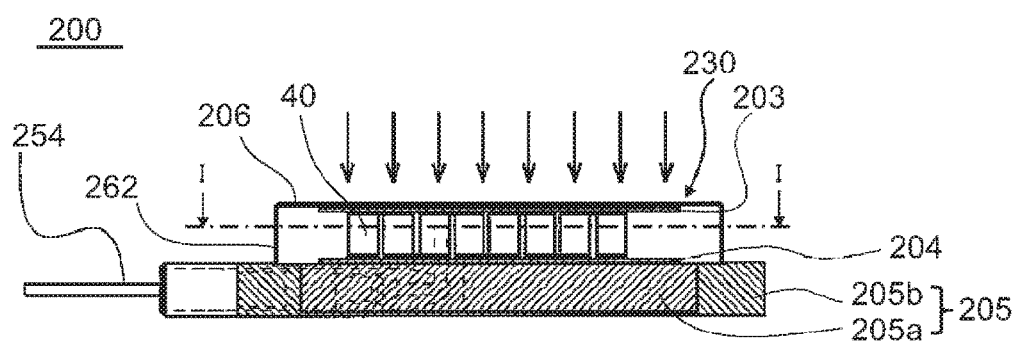
FIG. 3 is a schematic cross-sectional view illustrating a structure of a thermoelectric conversion module according to an embodiment.
Figure 4:
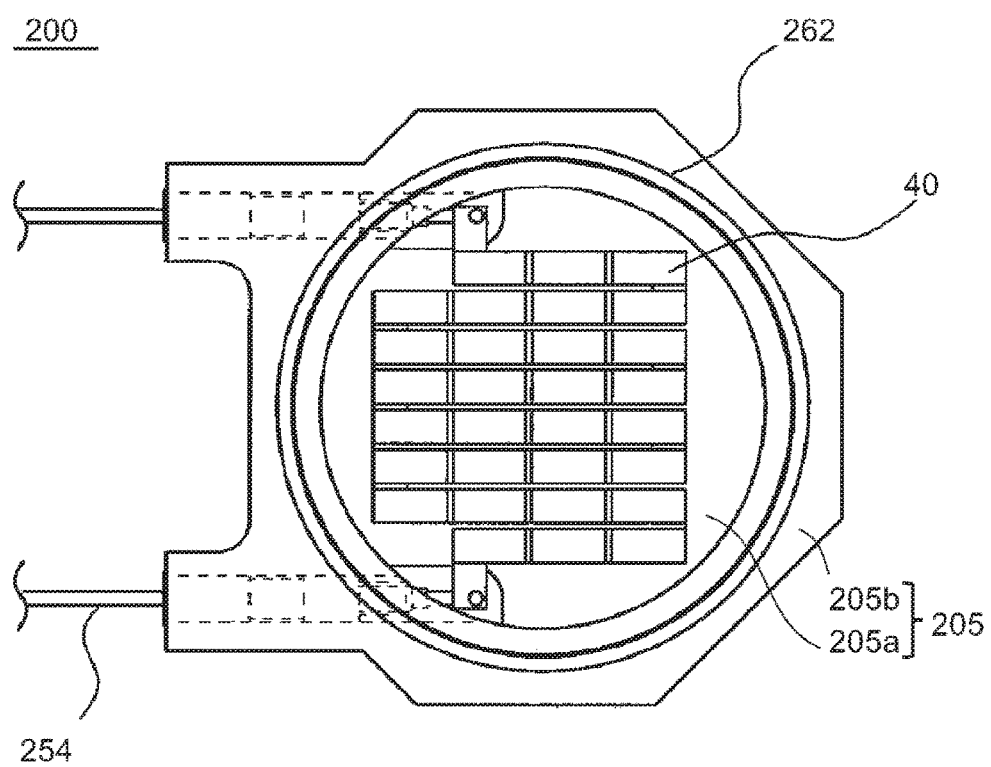
FIG. 4 is a plan view observed from a cross-section taken along one-dotted line I-I in FIG. 3 in a direction indicated by an arrow in the drawing.

FIG. 3 is a schematic cross-sectional view illustrating a structure of a thermoelectric conversion module 200 according to this embodiment. In addition, FIG. 4 is a plan view observed from a cross-section taken along one-dotted line I-I in FIG. 3 in a direction indicated by an arrow in the drawing. In addition, in FIG. 3 and FIG. 4, the thermoelectric conversion element 40 has a structure in which a plurality of pairs of the n-type thermoelectric conversion material 12 and the p-type thermoelectric conversion material 14 are electrically connected in series.

The thermoelectric conversion module 200 includes the thermoelectric conversion element 40, a container 230 that hermetically seals the thermoelectric conversion element 40, a first heat conductive insulating body 203, a second heat conductive insulating body 204. The container 230 includes a base portion 205 and a ceiling portion 206. In addition, the base portion 205 and the ceiling portion 206 are connected through a side wall portion 262 that approximately vertically extends from the base portion 205. In this embodiment, the ceiling portion 206 is heated to enter a high-temperature state, and at least a part of the base portion 205 is cooled down to enter a low-temperature state.

The first heat conductive insulating body 203 is inserted between one end of the thermoelectric conversion element 40 and an inner surface (a surface on an inner space side of the container 230) of the ceiling portion 206 of the container 230. On the other hand, the second heat conductive insulating body 204 is inserted between the other end of the thermoelectric conversion element 40 and an inner surface (a surface on an inner space side of the container 230) of the base portion 205 of the container 230. The first heat conductive insulating body 203 comes into close contact with the one end of the thermoelectric conversion element 40 and the inner surface of the ceiling portion 206 of the container 230, and the second heat conductive insulating body 204 comes into close contact with the other end of the thermoelectric conversion element 40 and the inner surface of the base portion 205 of the container 230.

The base portion 205 is formed in a flat shape. The base portion 205 includes a frame-shaped body 205b that constitutes a peripheral portion, and a thermal conductor 205a that constitutes the central portion. The base portion 205 is constituted by the frame-shaped body 205b of which the central portion is hollowed out in a circular shape, and the thermal conductor 205a that is fitted into the central portion of the frame-shaped body 205b.

In addition, the thermoelectric conversion element 40 is disposed on the thermal conductor 205a through the second heat conductive insulating body 204, and the first heat conductive insulating body 203 is disposed on the thermoelectric conversion element 40. In addition, the side wall portion 262 is disposed on the frame-shaped body 205b. In a case of this configuration, the thermal conductor 205a in the base portion 205 is cooled down.

In the thermoelectric conversion element 40 inside the container 230, the thermoelectric conversion material 10 is disposed in an array shape, and a plurality of the thermoelectric conversion materials 10 are connected in series. One end of a first lead (not illustrated) is connected to the second electrode 414 of the p-type thermoelectric conversion material 14 on the most front side among the plurality of thermoelectric conversion materials 10 which are connected in series. In addition, one end of a second lead (not illustrated) is connected to a third electrode 415 of the n-type thermoelectric conversion material 12 on the most rear side among the plurality of thermoelectric conversion materials 10 which are connected in series. The first lead and the second lead are connected to an outer side through a vacuum introduction terminal 254. The ceiling portion 206 is heated to enter a high-temperature state, and at least a part of the base portion 205 is cooled down to enter a low-temperature state. According to this, an electromotive force is generated, and is extracted from the vacuum introduction terminal 254 as electric energy.

Figure 5:
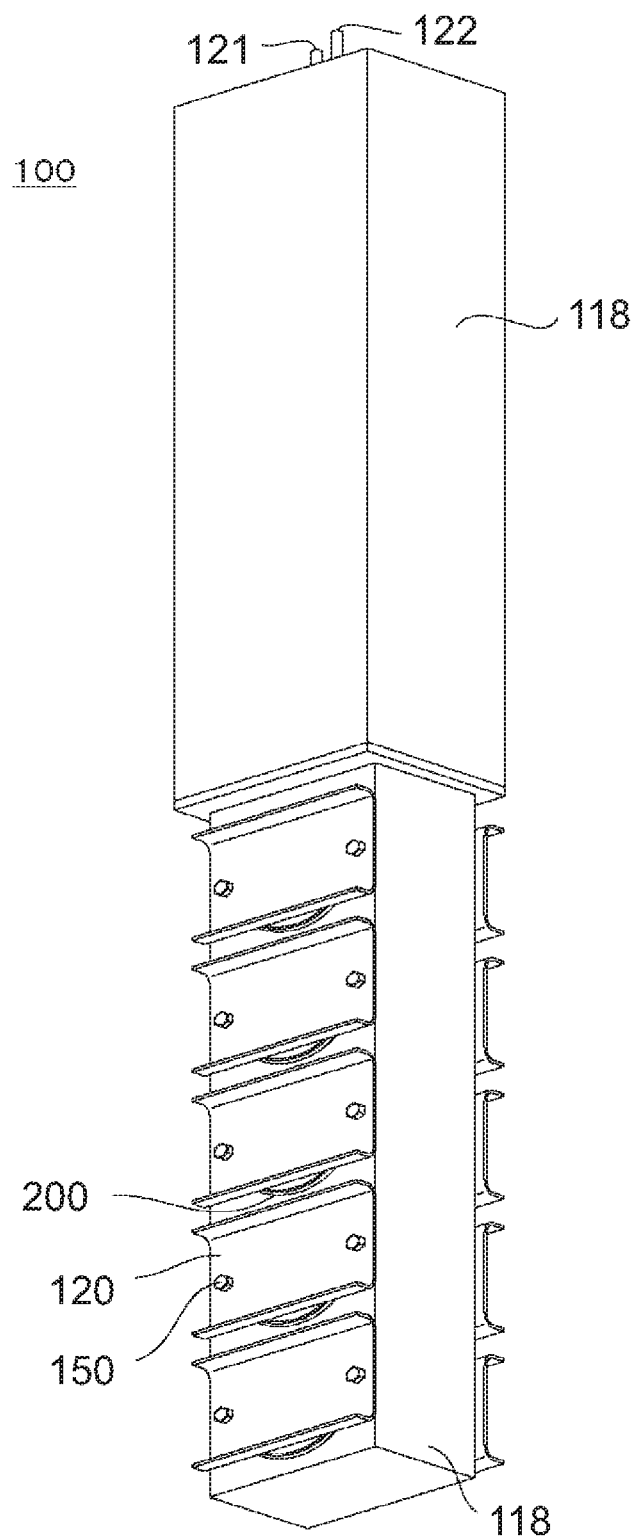
FIG. 5 is a perspective view of a thermoelectric generator according to an embodiment.

FIG. 5 is a perspective view of a thermoelectric generator 100 according to this embodiment. The thermoelectric generator 100 is a thermoelectric generator that includes the thermoelectric conversion element 40. The thermoelectric generator 100 includes the thermoelectric conversion module 200, and a fin 120. In addition, a cooling section (not illustrated) is provided inside a case 118.

One or a plurality of the thermoelectric conversion modules 200 are attached to an outer surface of the case 118. Each of the thermoelectric conversion modules 200 is attached in a state in which an outer surface of the base portion 205 comes into contact with the outer surface of the case 118. In addition, the plurality of thermoelectric conversion modules 200 are attached to two opposite surfaces of the case 118 to be opposite to each other with the case 118 interposed therebetween.

The cooling section, which is retained at a temperature lower than an outer temperature of the case 118, is positioned inside the case 118. An inlet port 121 and an outlet port 122 are provided to communicate with an inner space, and a cooling fluid is introduced into the inner space through the inlet port 121, and a cooled fluid flows out from the inner space through the outlet port 122. According to this, the cooled fluid can be made to flow.

For example, the fin 120 can be constituted by a material such as stainless steel having heat and corrosion resistance. In addition, the fin 120 extends in one direction to increase a surface area thereof, thereby having a configuration capable of easily absorbing heat from an outer space. The fin 120 is attached to an outer surface of the ceiling portion 206 of the container 230 in the thermoelectric conversion module 200. The thermoelectric conversion module 200 and the fin 120 are connected to each other by using an attachment bolt and a nut 150.

For example, the thermoelectric generator 100 according to this embodiment is provided in a high-temperature (for example, equal to or higher than 600° C. and equal to or lower than 900° C.) space. In this state, the fin 120 absorbs heat from an outer space, and enters a high-temperature state. The ceiling portion 206 of the container 230 of the thermoelectric conversion module 200, which is located on a fin 120 side, also enters a high-temperature state. On the other hand, the inside of the case 118 is retained at a temperature lower than a temperature (outer temperature) of the outer space by the cooling section. A bottom portion of the thermoelectric conversion module 200, which is in contact with the outer surface of the case 118, enters a low-temperature state. That is, a temperature difference occurs between the ceiling portion (high-temperature state) and the bottom portion (low-temperature state) of the container 230. One end of the thermoelectric conversion element 40, which is accommodated in the thermoelectric conversion module 200, enters a high-temperature state, and the other end enters a low-temperature state. That is, a temperature difference occurs between both of the ends of the thermoelectric conversion element 40, and thus an electromotive force is generated.

The thermoelectric generator 100 may be further provided with a transformer, a storage battery, a controller thereof, and the like to constitute a thermoelectric conversion system.

In addition, description has been given of the thermoelectric conversion element 40, the thermoelectric conversion module 200, the thermoelectric generator 100, and the thermoelectric conversion system, but these are illustrative only, and structures thereof are not limited to the above-described structures.

Next, the operation and effect of this embodiment will be described.

The thermoelectric conversion material according to this embodiment is excellent in thermoelectric conversion performance. In addition, it is possible to realize a thermoelectric conversion element, a thermoelectric conversion module, a thermoelectric generator, and a thermoelectric conversion system, which are excellent in thermoelectric conversion performance, by using the thermoelectric conversion material according to this embodiment.

In addition, the invention is not limited to the above-described embodiment, and variations, modifications, and the like in a range capable of achieving the object of the invention are included in the invention.

EXAMPLES

Hereinafter, the invention will be described in detail with reference to Examples. Furthermore, this embodiment is not limited to the description of Examples.

Preparation of Thermoelectric Conversion Material

Examples 1 to 4, and Comparative Examples 1 and 2

Raw material pure metals of respective elements, which constitute the thermoelectric conversion material, were put into a carbon crucible in a predetermined ratio and were heated and melted to a temperature of 1200° C. through heating with an electric furnace in an Ar gas atmosphere, and the resultant molten material was retained as was for 5 hours. Then, the molten material was rapidly cooled down with water. Then, the material, which was rapidly cooled down with water, was pulverized to obtain an alloy powder A having a skutterudite structure expressed by General Formula $Yb_{0.3}Ca_{0.1}Al_{0.1}Ga_{0.1}In_{0.1}Fe_{0.25}Co_{3.75}Sb_{12}$. In addition, an alloy powder B having a skutterudite structure expressed by General Formula $Yb_{0.3}Ca_{0.1}Al_{0.1}Ga_{0.1}In_{0.1}Fe_{0.25}Co_{3.75}Sb_{11.8}S_{0.2}$ was obtained in the same manner as described above except for the raw material ratio. In addition, the composition of the respective alloy powders, which were obtained, was measured through inductively coupled plasma (ICP) analysis.

In respective Examples and respective Comparative Examples, the alloy powder A and the alloy powder B were mixed in volume contents expressed in Table 1. Then, the resultant mixture, which was obtained, was put into a carbon die, and was heated in an Ar gas atmosphere at a pressure of 40 MPa. After retention at a temperature of 600° C. to 750° C. for 10 minutes, the resultant material was cooled down to room temperature to obtain a thermoelectric conversion material.

Comparative Example 3

Raw material pure metals of respective elements, which constitute the thermoelectric conversion material, were put into a carbon crucible in a predetermined ratio and were heated and melted to a temperature of 1200° C. through heating with an electric furnace in an Ar gas atmosphere, and the resultant molten material was retained as is for 5 hours. Then, the molten material was rapidly cooled down with water. Then, the material, which was rapidly cooled down with water, was pulverized to obtain an alloy powder C having a skutterudite structure expressed by General Formula $Yb_{0.3}Ca_{0.1}Al_{0.1}Ga_{0.1}In_{0.1}Fe_{0.25}Co_{3.75}Sb_{11.9}S_{0.1}$. In addition, the composition of the alloy powder C, which was obtained, was measured through inductively coupled plasma (ICP) analysis.

Next, the alloy powder C was put into a carbon die, and was heated in an Ar gas atmosphere at a pressure of 40 MPa. After retention at a temperature of 600° C. to 750° C. for 10 minutes, the resultant material was cooled down to room temperature to obtain a thermoelectric conversion material.

From confirmation by using an X-ray diffraction method, it could be seen that all of the thermoelectric conversion materials, which were obtained in respective Examples and respective Comparative Examples, had the skutterudite structure.

[Evaluation of Thermoelectric Conversion Material]

The following evaluation was performed with respect to the thermoelectric conversion materials of respective Examples and respective Comparative Examples.

(Presence or Absence of Two or More Phases)

It was confirmed whether or not each of the thermoelectric conversion materials included two or more phases. Specifically, a small piece was cut out from each of the thermoelectric conversion materials which were obtained in respective Examples and respective Comparative Examples, and was processed and polished into a sample having a flat surface (exposed surface of a cross-section). Next, the flat surface of the sample was subjected to structure observation and component analysis through SEM-EDX by using a scanning electron microscope (S4700, manufactured by Hitachi High-Technologies Corporation). From the results of the EDX analysis, a case where presence of a region that included sulfur (S) and a region that did not include S was confirmed was evaluated as "presence" of two or more phases. In addition, a case where the two kinds of regions were not confirmed was evaluated as "absence" of two or more phases.

(Evaluation of Thermoelectric Conversion Performance)

With respect to the thermoelectric conversion materials of respective Examples and respective Comparative Examples, the Seebeck coefficient S, the electrical resistivity ρ, and the thermal conductivity κ in a temperature range of 100° C. to 600° C. were measured, and the power factor P and the dimensionless figure of merit ZT were calculated, respectively. Specifically, with respect to a columnar specimen of the thermoelectric conversion material, the Seebeck coefficient S and the electrical resistivity ρ were measured with a thermoelectric performance measuring device (ZEM-2, manufactured by Ulvac rico Co., Ltd). At this time, the columnar specimen was set to have a columnar shape having dimensions of l×w×h, of which 1 was set to 2.5 mm, w was set to 2.5 mm, and h was set to 15 mm. In addition, with respect to a disk-shaped specimen of the thermoelectric conversion material, a density d was measured with a density meter at room temperature, and thermal diffusivity α was measured at each temperature by using a laser flash method thermal constant measuring device (TC-7000H,

TABLE 1

| | | | Example 1 | Example 2 | Example 3 | Example 4 | Comparative Example 1 | Comparative Example 2 | Comparative Example 3 |
|---|---|---|---|---|---|---|---|---|---|
| Manufacturing process | Volume content of alloy powder (%) | Alloy powder A | 50 | 40 | 60 | 80 | 100 | — | — |
| | | Alloy powder B | 50 | 60 | 40 | 20 | — | 100 | — |
| | | Alloy powder C | — | — | — | — | — | — | 100 |
| Evaluation | Presence or absence of two or more phases | | Presence | Presence | Presence | Presence | Absence | Absence | Absence |
| | Maximum value of ZT | | 1.17 | 1.03 | 1.04 | 1.04 | 0.93 | 0.86 | 0.94 |
| | Maximum value of thermal conductivity [W/(m · K)] | | 3.47 | 3.36 | 3.64 | 3.76 | 3.98 | 3.75 | 3.61 |
| | Maximum value of electrical resistivity [×10$^{-6}$ Ω · m] | | 11.11 | 12.45 | 10.96 | 9.79 | 10.21 | 18.91 | 13.54 |
| | Maximum value of power factor [×10$^{-3}$ W/(m · K$^2$)] | | 3.88 | 3.48 | 3.81 | 3.96 | 3.72 | 3.03 | 3.42 | manufactured by Ulvac rico Co., Ltd). In addition, specific heat $C_p$ of the thermoelectric conversion material in a temperature range of 100° C. to 600° C. was measured by using a thermal analyzer for differential scanning calorimetry. The thermal conductivity κ was obtained from a relationship of $κ=α·d·C_p$ by using the density d, the specific heat $C_p$, and the thermal diffusivity α which were measured. In addition, the dimensionless figure of merit ZT was calculated by using Expression (2) described in the embodiment, and the power factor P was calculated by using Expression (3) described in the embodiment.

Results of respective Examples and respective Comparative Examples are illustrated in FIG. 6A to FIG. 9B.

Figure 6A:
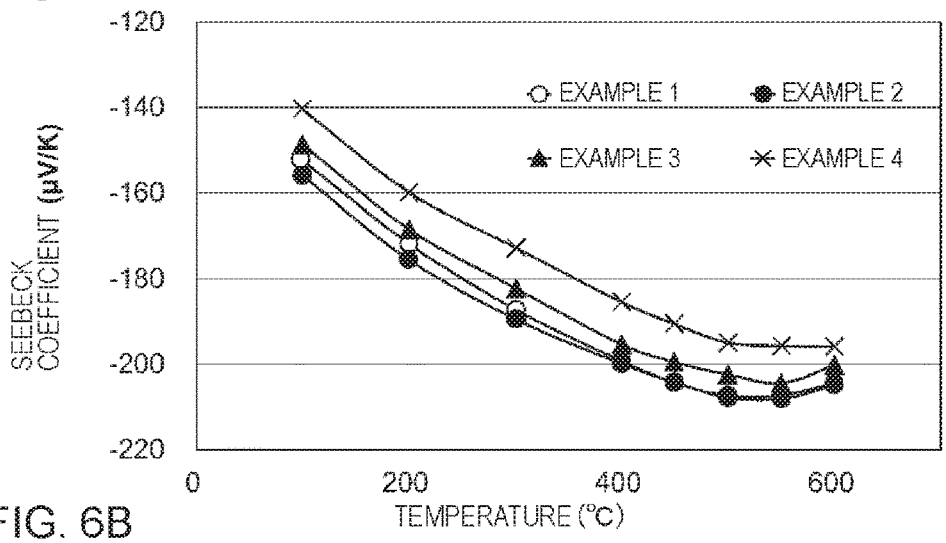
FIG. 6A is a view illustrating Seebeck coefficients S of respective Examples.
Figure 6B:
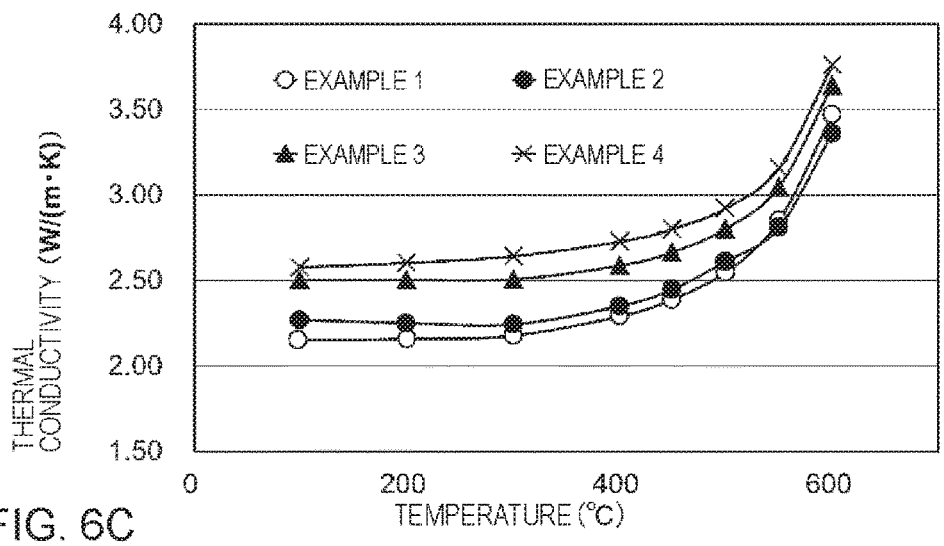
FIG. 6B is a view illustrating thermal conductivity κ of respective Examples.
Figure 6C:
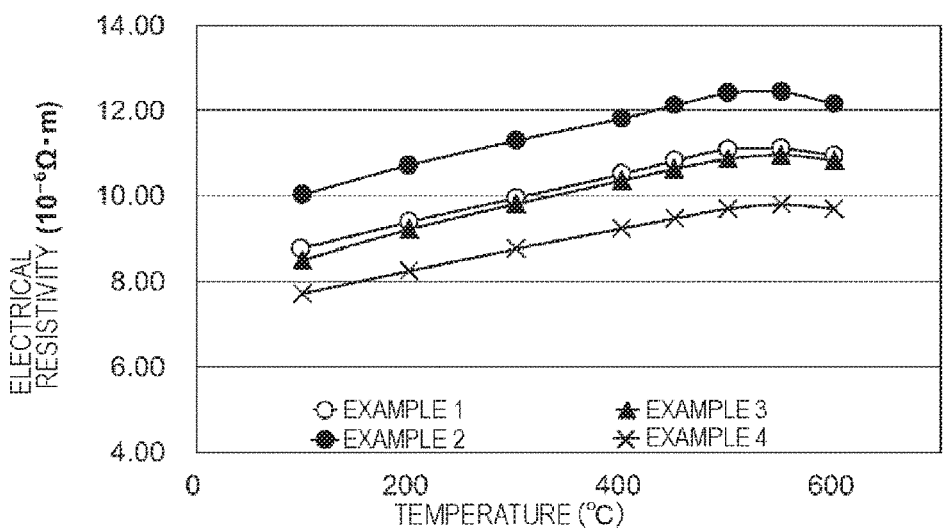
FIG. 6C is a view illustrating electrical resistivity ρ of respective Examples.
Figure 7A:
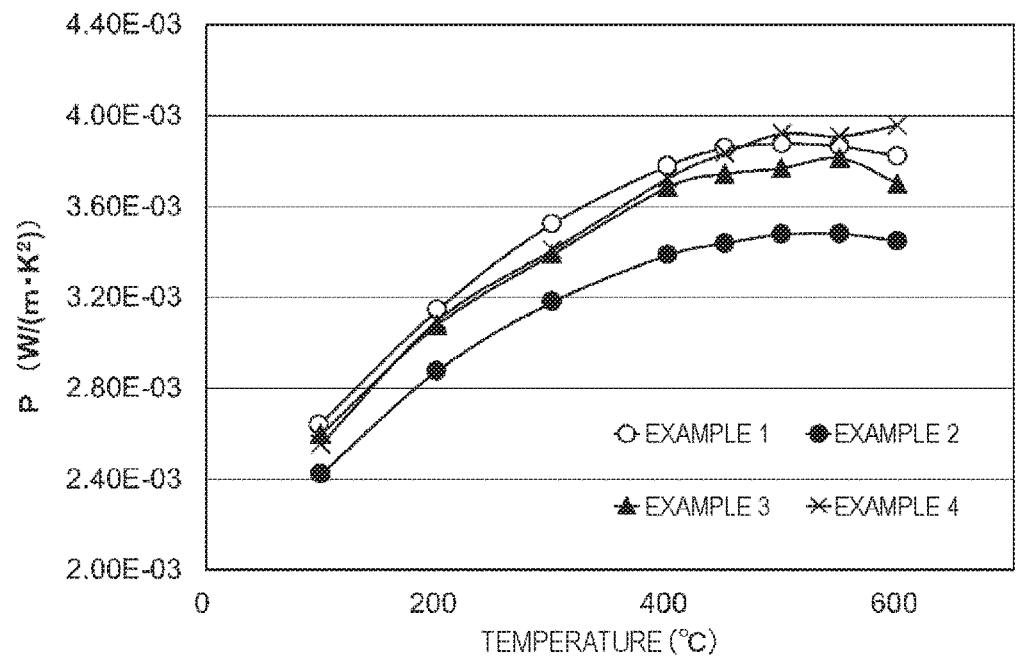
FIG. 7A is a view illustrating power factors P of respective Examples.
Figure 7B:
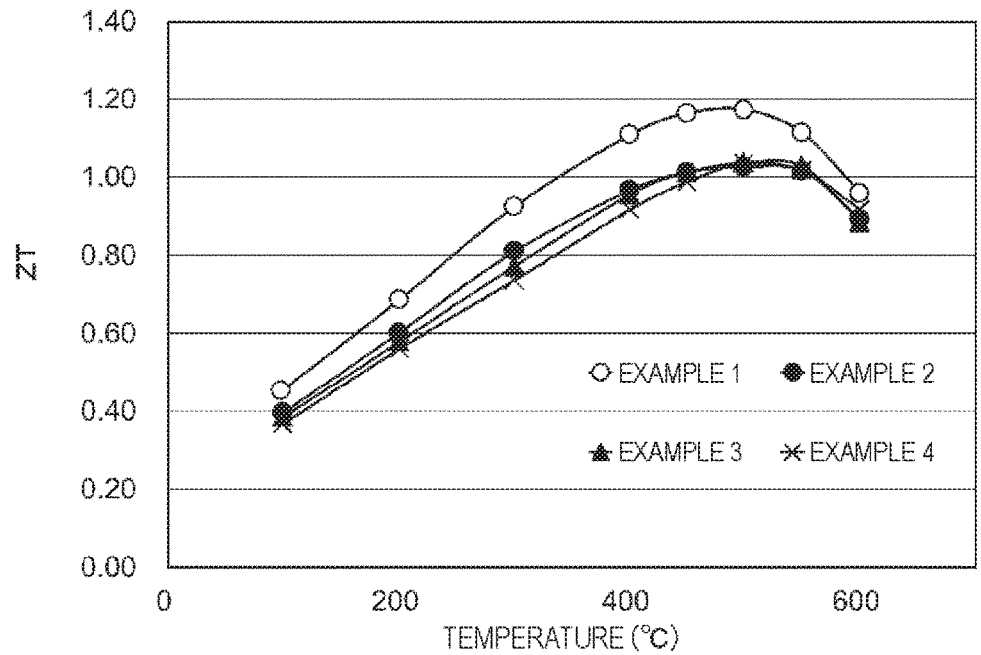
FIG. 7B is a view illustrating dimensionless figures of merit ZT of respective Examples.
Figure 8A:
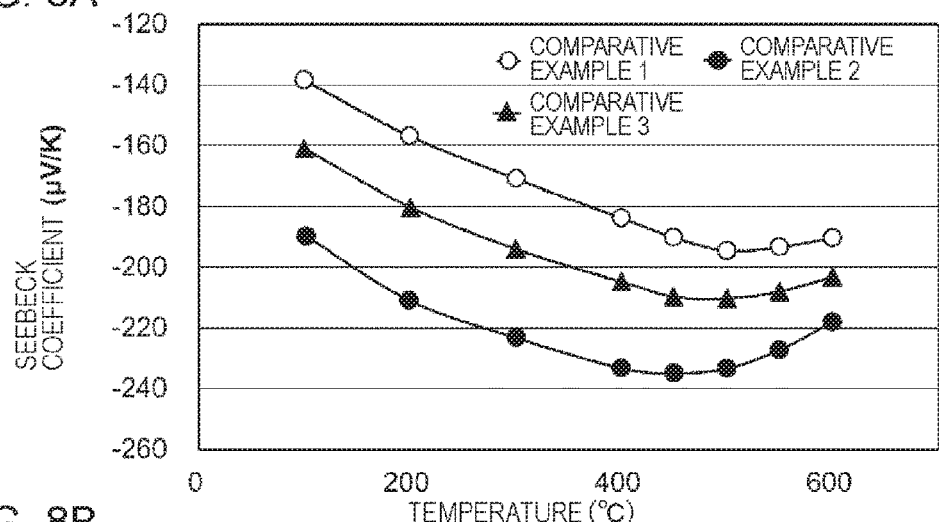
FIG. 8A is a view illustrating the Seebeck coefficients S of respective Comparative Examples.
Figure 8B:
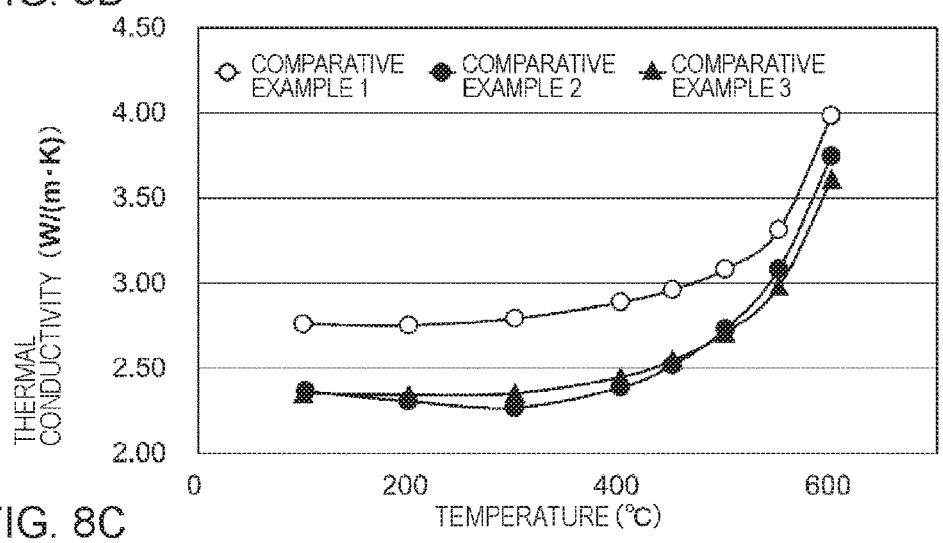
FIG. 8B is a view illustrating the thermal conductivity κ of respective Comparative Examples.
Figure 8C:
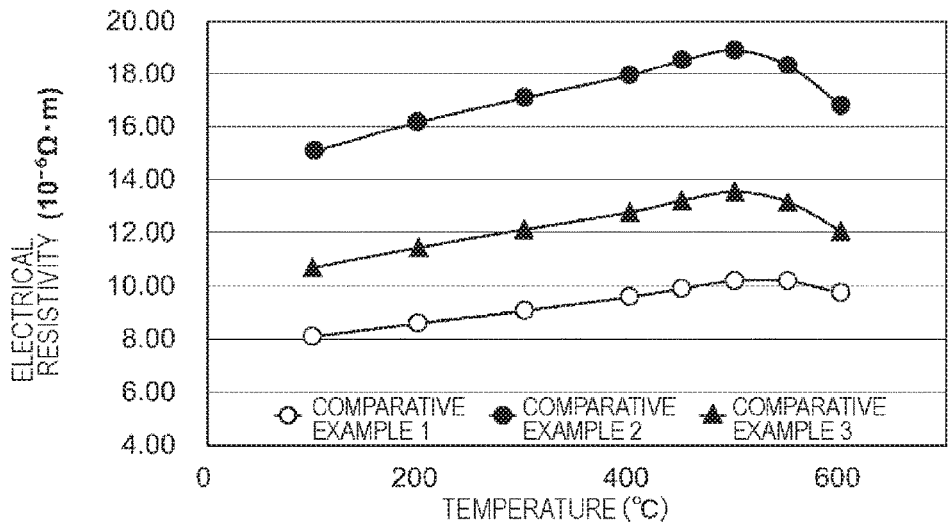
FIG. 8C is a view illustrating the electrical resistivity ρ of respective Comparative Examples.
Figure 9A:
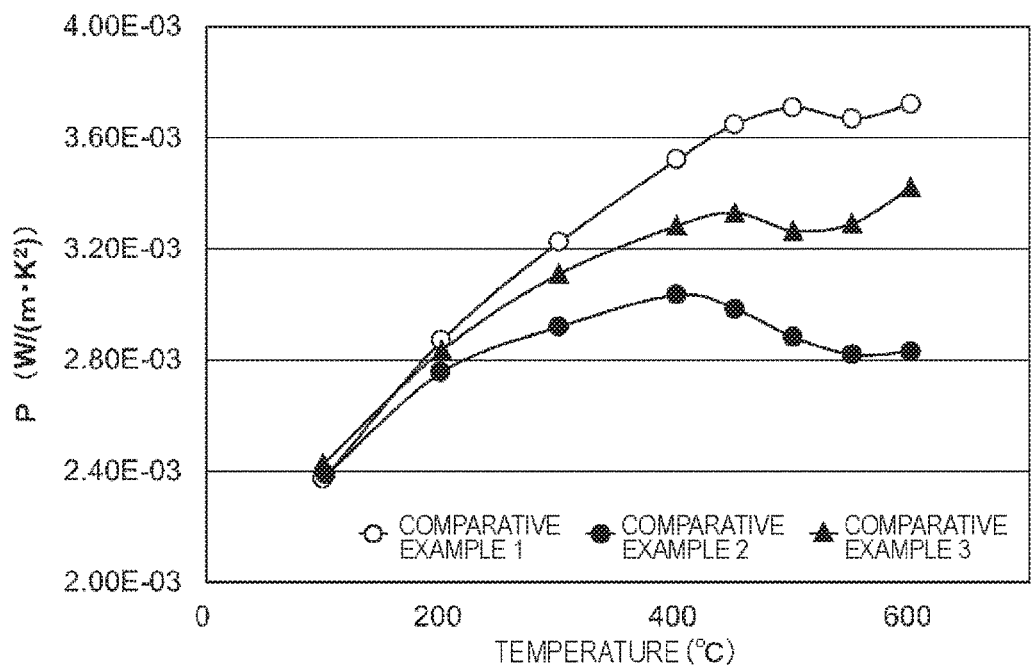
FIG. 9A is a view illustrating the power factors P of respective Comparative Examples.
Figure 9B:
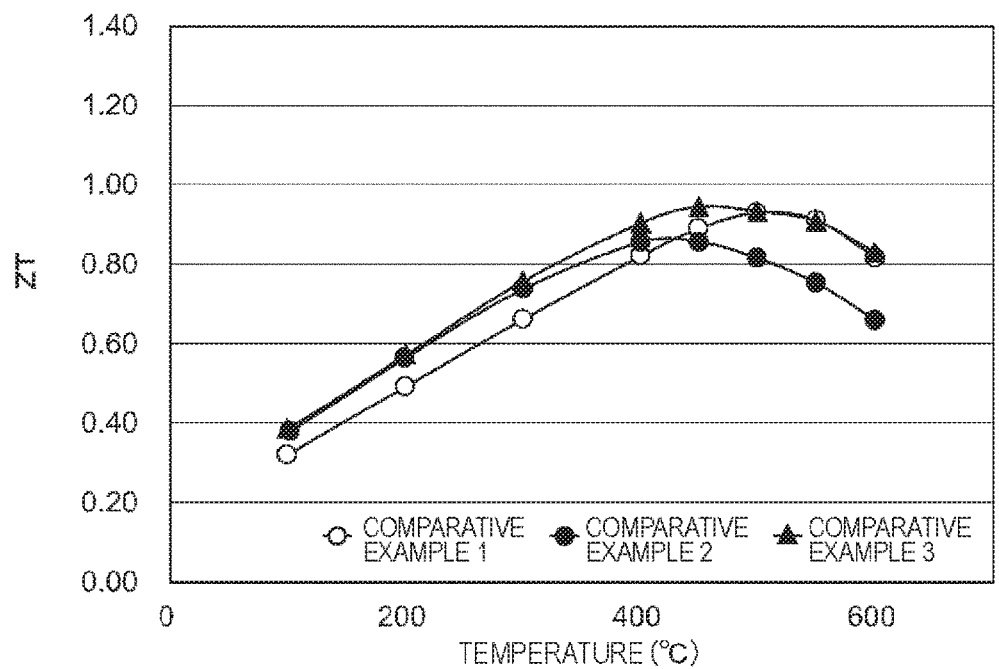
FIG. 9B is a view illustrating the dimensionless figures of merit ZT of respective Comparative Examples.

FIG. 6A is a view illustrating the Seebeck coefficients S of respective Examples, FIG. 6B is a view illustrating the thermal conductivity κ of respective Examples, and FIG. 6C is a view illustrating the electrical resistivity ρ of respective Examples. FIG. 7A is a view illustrating the power factors P of respective Examples, and FIG. 7B is a view illustrating the dimensionless figures of merit ZT of respective Examples. FIG. 8A is a view illustrating the Seebeck coefficients S of respective Comparative Examples, FIG. 8B is a view illustrating the thermal conductivity κ of respective Comparative Examples, and FIG. 8C is a view illustrating the electrical resistivity ρ of respective Comparative Examples. FIG. 9A is a view illustrating the power factors P of respective Comparative Examples, and FIG. 9B is a view illustrating the dimensionless figures of merit ZT of respective Comparative Examples. In addition, in respective Examples and respective Comparative Examples, presence or absence of two or more phases, and among values which were obtained, the maximum value of ZT, the maximum value of the thermal conductivity κ, the maximum value of the electrical resistivity ρ, and the maximum value of the power factor P are collectively illustrated in Table 1. In the thermoelectric conversion materials of Examples 1 to 4, the maximum value of ZT was greater in comparison to the thermoelectric conversion materials of Comparative Examples 1 to 3.

From the results which are illustrated in FIG. 6A to FIG. 9B, and Table 1, it could be confirmed that the thermoelectric conversion materials of Example 1 to Example 4 has the thermoelectric conversion performance higher than that of the thermoelectric conversion materials of Comparative Examples 1 to 3.

(Volume Content)

With respect to Example 1, the volume content of each phase in the thermoelectric conversion material was further measured. Specifically, first, a cross-sectional structure of a thermoelectric conversion material was observed with scanning electron microscopes (FE-SEM:Supra-35, manufactured by Carl Zeiss corporation, and FE-SEM:S-4700, manufactured by Hitachi, Ltd.). In addition, composition analysis of the cross-sectional structure of the thermoelectric conversion material was performed with an electron beam micro analyzer (FE-EPMA:JXA-8500, manufactured by JEOL Ltd.), and energy dispersive X-ray analysis (EDX or EDS).

Figure 10:
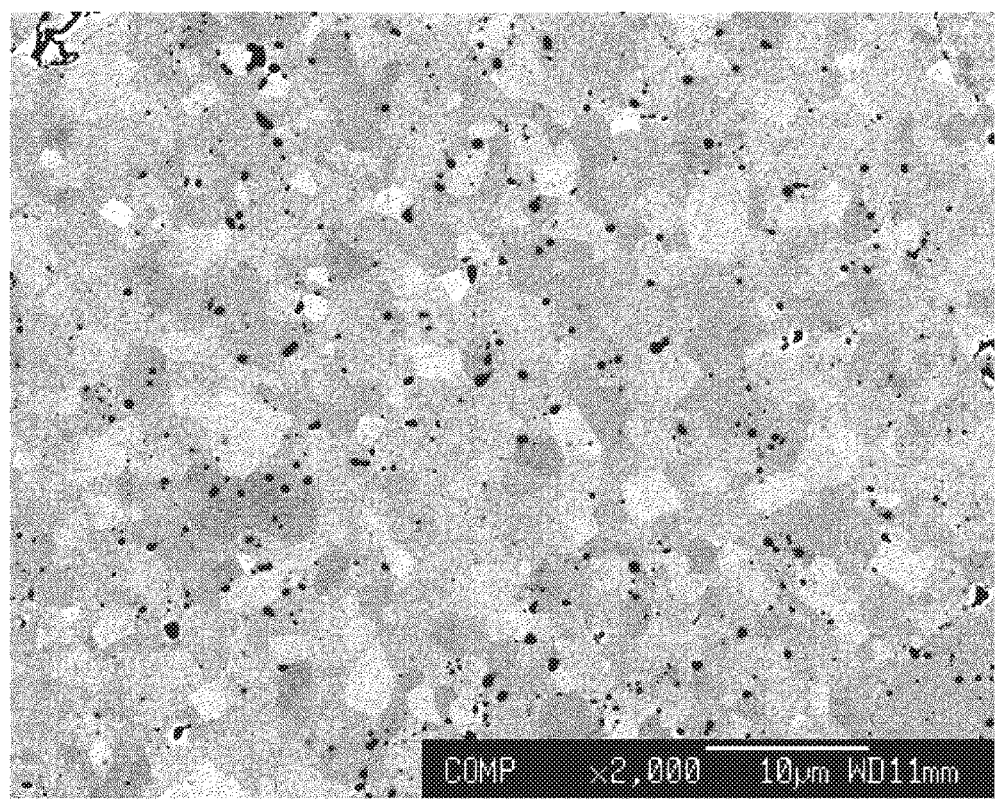
FIG. 10 is a view illustrating a result obtained by observing a cross-section of the thermoelectric conversion material of Example 1 with a scanning electron microscope.

FIG. 10 is a view illustrating a result obtained by observing a cross-section of the thermoelectric conversion material of Example 1 with the scanning electron microscope. From the drawing, it was confirmed that the thermoelectric conversion material was constituted by a plurality of grain aggregates. In addition, FIG. 11A and FIG. 11B are views illustrating composition analysis results of the cross-section of the thermoelectric conversion material of Example 1 through energy dispersive X-ray analysis EDX (or EDS).

Figure 11A:
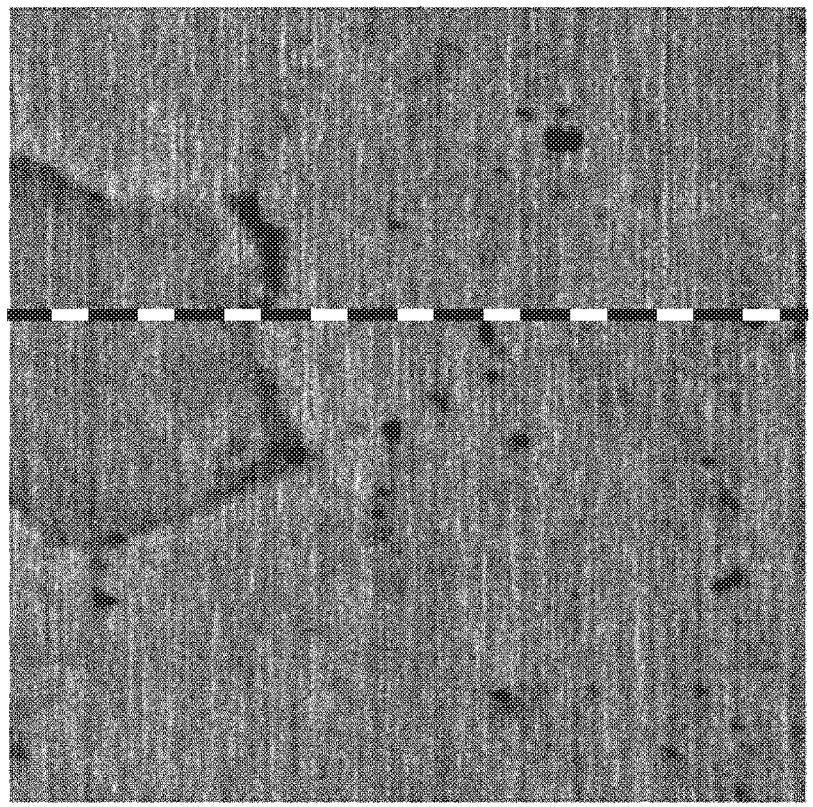
FIG. 11A and FIG. 11B are views illustrating composition analysis results of the cross-section of the thermoelectric conversion material of Example 1 through energy dispersive X-ray analysis.
Figure 11B:
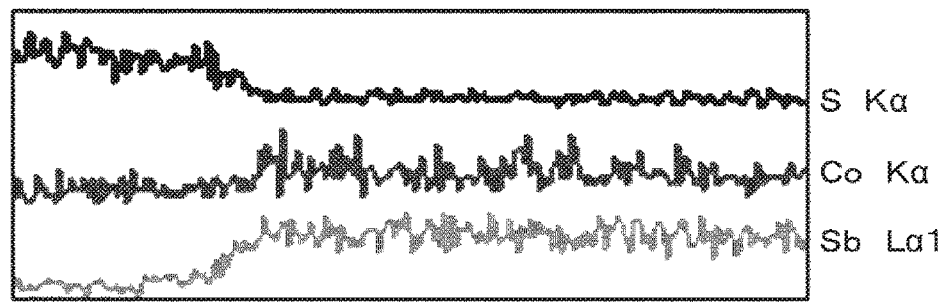

Specifically, FIG. 11A is a view illustrating a shape of a region that was analyzed, and FIG. 11B is a view illustrating a line profile at a position indicated by a broken line in FIG. 11A. From the drawings, it could be confirmed that in grain aggregates in Example 1 of which a cross-section was observed, a grain aggregate that included sulfur (S) and a grain aggregate that did not include S were present. As described above, it was determined whether each of the grain aggregates was the grain aggregate (phase) that included S or the grain aggregate (phase) that did not include S. Then, on an exposed cross-section, an area ratio between an area occupied by the phase that did not include S, and an area occupied by the phase that included S was calculated. In addition, the area ratio, which was obtained, was regarded as a volume ratio $V_1:V_2$ between a volume $V_1$ of the phase that did not include S, and a volume $V_2$ of the phase that included S. As a result, in Example 1, $V_1:V_2$ of 50:50 was obtained. This corresponds to the volume ratio of 50:50 between the alloy powder A and the alloy powder B in a manufacturing process. Accordingly, it could be confirmed that the volume ratio between the phases in the thermoelectric conversion material that was obtained is based on an introduction ratio between the alloy powders. In this regard, it can be seen that the volume ratio between the volume of the phase that did not include S and the volume of the phase that included S is the same as the volume ratio between the alloy powder A and the alloy powder B which were used in the manufacturing process also in Examples 2 to 4. In addition, in Examples 1 to 4, it could be seen that each volume content of the phase that did not include S and the phase that included S was equal to or more than 10%.

Figure 12A:
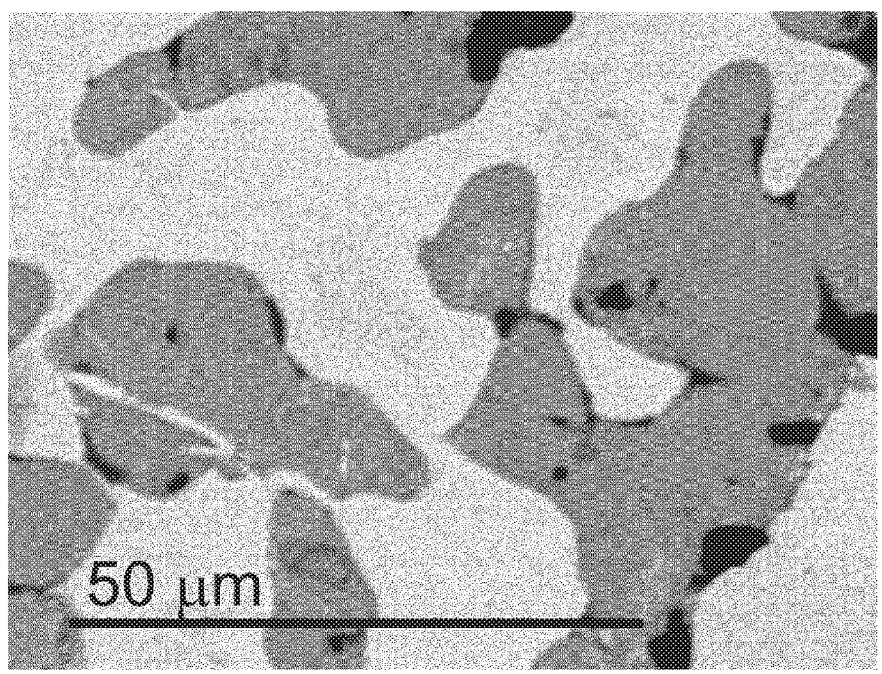
FIG. 12A is a view illustrating a result obtained by observing a cross-section of a thermoelectric conversion material, which is manufactured by using an alloy powder A and an alloy powder D, with a scanning electron microscope.
Figure 12B:
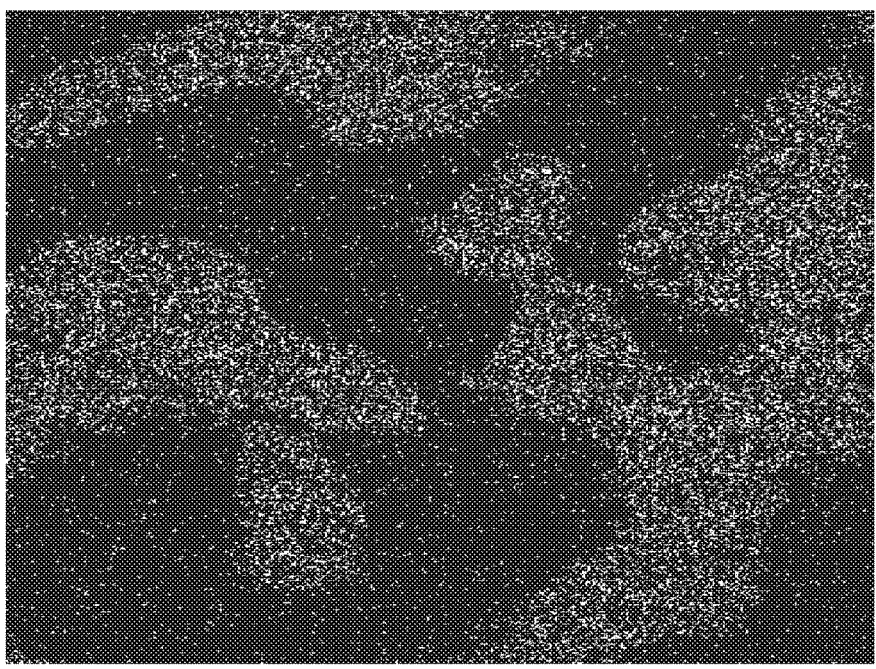
FIG. 12B is a view illustrating a composition mapping result of sulfur (S) through the energy dispersive X-ray analysis.

In addition, FIG. 12A is a view illustrating a result obtained by observing a cross-section of a thermoelectric conversion material, which was prepared by using an alloy powder D having a skutterudite structure expressed by General Formula $Yb_{0.3}Ca_{0.1}Al_{0.1}Ga_{0.1}In_{0.1}Fe_{0.25}Co_{3.75}Sb_{11.25}S_{0.75}$ instead of the alloy powder B, with a scanning electron microscope. As can be seen from the drawing, two kinds of grain aggregates having a contrast different in each case were observed. In addition, FIG. 12B is a view illustrating a composition mapping result of sulfur (S) through the energy dispersive X-ray analysis (EDX or EDS). The drawing illustrates that a relatively large amount of S is included in a portion with relatively low brightness. In a case where a compositional difference between phases is great, as described above, a ratio between areas occupied by respective phases can be obtained from the composition mapping result, and can be regarded as the volume contents of the respective phases.

It is apparent that the present invention is not limited to the above embodiment, and may be modified and changed without departing from the scope and spirit of the invention.

What is claimed is:

1. A thermoelectric conversion material, comprising:
a plurality of phases including a first phase and a second phase which have elemental compositions different from each other,
wherein the first phase and the second phase have a skutterudite structure,
each of the first phase and the second phase has a composition that is expressed by General Formula $R_rT_4X_x$ ($0≤r≤1$, $3≤t≤5$, and $9≤x≤15$),
R represents four or more elements selected from the group consisting of rare-earth elements, alkali metal elements, alkali-earth metal elements, elements of Group 4, and elements of Group 13, the four or more elements including three kinds of elements of groups different from each other, T represents one or more elements selected from the group consisting of transition metal elements excluding rare-earth elements and elements of Group 4, X represents one or more elements selected from the group consisting of elements of Group 14, elements of Group 15, and elements of Group 16, and in one of the first phase and the second phase, X includes sulfur, and in other one of the first phase and the second phase, X does not include sulfur.

2. The thermoelectric conversion material according to claim 1, wherein each volume content of the first phase and the second phase is equal to or more than 10%.

3. The thermoelectric conversion material according to claim 1, wherein the maximum value of a dimensionless figure of merit ZT in a temperature range of equal to or higher than 100° C. and equal to or lower than 600° C. is equal to or more than 0.70.

4. The thermoelectric conversion material according to claim 1, wherein the maximum value of thermal conductivity in a temperature range of equal to or higher than 100° C. and equal to or lower than 600° C. is equal to or less than 4.00 W/(m·K).

5. The thermoelectric conversion material according to claim 1, wherein the maximum value of electrical resistivity in a temperature range of equal to or higher than 100° C. and equal to or lower than 600° C. is equal to or less than $18.00 \times 10^{-6} \Omega \cdot m$.

6. A thermoelectric conversion element, comprising:
the thermoelectric conversion material according to claim 1; and
an electrode.

7. A thermoelectric conversion module, comprising:
the thermoelectric conversion element according to claim 6.

8. A thermoelectric generator, comprising:
the thermoelectric conversion element according to claim 6.

9. A thermoelectric conversion system, comprising:
the thermoelectric conversion element according to claim 6.

10. A method of manufacturing a thermoelectric conversion material, comprising:
preparing a plurality of alloy powders;
obtaining a mixture in which the plurality of alloy powders are mixed; and
sintering the mixture,
wherein the plurality of alloy powders include a first alloy powder, and a second alloy powder that is different from the first alloy powder, and
the first alloy powder and the second alloy powder have a skutterudite structure,
each of the first alloy powder and the second alloy powder has a composition that is expressed by General Formula $R_r T_t X_x$ ($0 \leq r \leq 1$, $3 \leq t \leq 5$, and $9 \leq x \leq 15$),
R represents four or more elements selected from the group consisting of rare-earth elements, alkali metal elements, alkali-earth metal elements, elements of Group 4, and elements of Group 13, the four or more elements including three kinds of elements of groups different from each other,
T represents one or more elements selected from the group consisting of transition metal elements excluding rare-earth elements and elements of Group 4,
X represents one or more elements selected from the group consisting of elements of Group 14, elements of Group 15, and elements of Group 16, and
in one of the first alloy powder and the second alloy powder, X includes sulfur, and in other one of the first alloy powder and the second alloy powder, X does not include sulfur.

11. The method of manufacturing a thermoelectric conversion material according to claim 10, wherein each volume content of the first alloy powder and the second alloy powder in the mixture is equal to or more than 10%.

* * * * *